(12) United States Patent
Qian et al.

(10) Patent No.: US 10,079,061 B2
(45) Date of Patent: Sep. 18, 2018

(54) SYSTEM AND METHOD FOR PROGRAMMING SPLIT-GATE, NON-VOLATILE MEMORY CELLS

(71) Applicant: Silicon Storage Technology, Inc., San Jose, CA (US)

(72) Inventors: Xiaozhou Qian, Shanghai (CN); Viktor Markov, Santa Clara, CA (US); Jong-Won Yoo, Cupertino, CA (US); Xiao Yan Pi, Shanghai (CN); Alexander Kotov, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/084,955

(22) Filed: Mar. 30, 2016

(65) Prior Publication Data
US 2016/0336072 A1    Nov. 17, 2016

(30) Foreign Application Priority Data
Apr. 9, 2015 (CN) .......................... 2015 1 0166483

(51) Int. Cl.
| | | |
|---|---|---|
| *G11C 11/34* | (2006.01) | |
| *G11C 16/12* | (2006.01) | |
| *G11C 16/04* | (2006.01) | |
| *G11C 16/10* | (2006.01) | |

(52) U.S. Cl.
CPC .......... *G11C 16/12* (2013.01); *G11C 16/0425* (2013.01); *G11C 16/10* (2013.01)

(58) Field of Classification Search
CPC ...... G11C 16/12; G11C 16/0425; G11C 16/10

USPC .......................... 365/185.18, 185.14, 185.28
See application file for complete search history.

(56) References Cited

U.S. PATENT DOCUMENTS

| | | |
|---|---|---|
| 5,187,683 A | 2/1993 | Gill |
| 6,259,132 B1 | 7/2001 | Pio |
| 6,834,012 B1 * | 12/2004 | He ..................... G11C 16/3404 365/185.18 |
| 7,864,595 B2 | 1/2011 | Bae |
| 7,868,375 B2 | 1/2011 | Liu et al. |
| 7,986,553 B2 | 7/2011 | Roohparvar |
| 8,488,388 B2 * | 7/2013 | Markov ............. G11C 16/0416 257/319 |
| 2005/0007824 A1 * | 1/2005 | Chih ................... G11C 16/0425 365/185.18 |
| 2005/0088879 A1 | 4/2005 | Kim |
| 2005/0265080 A1 | 12/2005 | Hisamoto |
| 2007/0158737 A1 | 7/2007 | Yang et al. |
| 2009/0273014 A1 * | 11/2009 | Arigane ............ H01L 27/11568 257/315 |

(Continued)

FOREIGN PATENT DOCUMENTS

CN          103106922 A      5/2013

OTHER PUBLICATIONS

Yao, et al., "Method for Endurance Optimization of the HIMOS™ Flash Memory Cell," IEEE 43rd Annual International Reliability Physics Symposium, San Jose, 2005, pp. 662-663.

*Primary Examiner* — Anthan Tran
(74) *Attorney, Agent, or Firm* — Brent Yamashita; DLA Piper LLP US

(57) ABSTRACT

The disclosed embodiments comprise a flash memory device and a method of programming the device in a way that reduces degradation of the device compared to prior art methods.

8 Claims, 9 Drawing Sheets

(56) References Cited

U.S. PATENT DOCUMENTS

2011/0267883 A1   11/2011   Lee
2013/0163324 A1*  6/2013   Noh .................... G11C 11/5628
                                                      365/185.02
2015/0262675 A1*  9/2015   Lin .................... G11C 16/3459
                                                      365/185.12

* cited by examiner

SYSTEM AND METHOD FOR PROGRAMMING SPLIT-GATE, NON-VOLATILE MEMORY CELLS

RELATED APPLICATIONS

This application claims the benefit of Chinese Patent Application No. 201510166483.7 filed on Apr. 9, 2015.

TECHNICAL FIELD

The disclosed embodiments relate to the programming of split-gate, non-volatile memory cells.

BACKGROUND OF THE INVENTION

Non-volatile memory cells are well known in the art. One prior art non-volatile split gate memory cell 100 is shown in FIG. 1. The memory cell 100 comprises a semiconductor substrate 170 of a first conductivity type, such as P type. The substrate 170 has a surface on which there is formed a first region 160 (also known as the source line SL) of a second conductivity type, such as N type. A second region 110 (also known as the drain line or bit line) also of N type is formed on the surface of the substrate 170. Between the first region 160 and the second region 110 is a channel region 180.

A word line 120 (WL) is positioned above a first portion of the channel region 180 and is insulated therefrom. The word line 120 has little or no overlap with the second region 110.

A floating gate 140 (FG) is over another portion of the channel region 180. The floating gate 140 is insulated therefrom, and is adjacent to the word line 120. The floating gate 140 is also adjacent to the first region 160. The floating gate 140 may overlap the first region 160 to provide coupling from the first region 160 into the floating gate 140.

A coupling gate 130 (CG, also known as control gate) is over the floating gate 140 and is insulated therefrom.

An erase gate 150 (EG) is over the first region 160 and is adjacent to the floating gate 140 and the coupling gate 130 and is insulated therefrom. The top corner of the floating gate 140 may point toward the inside corner of the T-shaped erase gate 150 to enhance erase efficiency. The erase gate 150 is also insulated from the first region 160.

The cell 100 is more particularly described in U.S. Pat. No. 7,868,375 whose disclosure is incorporated herein by reference in its entirety.

One exemplary operation for erase and program of prior art non-volatile memory cell 100 is as follows. The cell 100 is erased, through a Fowler-Nordheim tunneling mechanism, by applying a high voltage on the erase gate 150 with other terminals equal to zero volts. Electrons tunnel from the floating gate 140 into the erase gate 150 causing the floating gate 140 to be positively charged, turning on the cell 100 in a read condition. The resulting cell erased state is known as '1' state.

The cell 100 is programmed, through a source side hot electron programming mechanism, by applying a high voltage on the coupling gate 130, a medium voltage on the source line 160, a medium voltage on the erase gate 150, and a programming current on the bit line 110. A portion of electrons flowing across the gap between the word line 120 and the floating gate 140 acquire enough energy to inject into the floating gate 140 causing the floating gate 140 to be negatively charged, turning off the cell 100 in read condition. The resulting cell programmed state is known as '0' state.

The programming operation causes substantial stress on memory cell 100. For example, over time, electrons will become trapped in the insulation layer between floating gate 140 and substrate 170 as a result of the hot electron programming mechanism. This electron trapping effect will result in higher voltages being required for erase and programming operations, which results in lower erase efficiency and programming efficiency of memory cell 100.

The prior art includes some attempts to mitigate the degradation caused by programming operations. FIG. 2 depicts a conventional control gate pulse 210 applied to control gate 130 during a programming operation. The peak voltage of control gate pulse 210 ranges between 10 and 11 volts. FIG. 3 depicts a prior art method 300 that attempts to mitigate degradation compared to the method of FIG. 2 by staging the beginning of the control gate voltage 330 applied to control gate 130, the erase gate voltage 340 applied to erase gate 150, the word line voltage 350 applied to word line 120, the voltage differential 320 applied to source line 160, and voltage 310 applied to bit line 110 during a programming operation. The method of FIG. 3 is described in U.S. Pat. No. 8,488,388.

Another prior art method 400 is depicted in FIG. 4. There, a ramped voltage 410 is applied to control gate 130 during a programming operation instead of the control gate pulse 210 of FIG. 2. Prior art method 400 is described in T. Yao, A. Lowe, T. Vermeulen, N. Bellafiore, J. V. Houdt, and D. Wellekens, "Method for endurance optimization of the HIMOS™ flash memory cell," IEEE 43rd Annual International Reliability Physics Symposium, 2005, pp. 662-663.

These prior art methods have drawbacks. Method 200 does not mitigate degradation caused by peak voltage stress. Method 300 can mitigate degradation at a cost of longer programming time. Method 400 requires additional circuitry to regulate control gate voltage ramp. In addition, the method 400 of FIG. 4 requires greater time for a programming cycle than the method 200 of FIG. 2. For example, in order to utilize ramped voltage effects to mitigate degradation when data require many words/bytes to be programmed by the method 400, one has to ramp voltage up and down each time a word/byte is programmed. As a result, the total data programming time is increased. Additionally, charging and discharging high voltage gate each program cycle can increase power consumption.

What is needed is an improved design that reduces degradation in the memory cell. What is further needed is an improved design that reduces degradation but does not require greater time for programming operations than the conventional method. What is further needed is an improved design that reduces degradation and actually require less time for programming operations than the conventional method.

SUMMARY OF THE INVENTION

The disclosed embodiments comprise a flash memory device and a method of programming the device in a way that reduces degradation of the device compared to prior art methods. In some embodiments, the programming time is reduced compared to the prior art methods.

DETAILED DESCRIPTION OF THE PREFERRED EMBODIMENT

Figure 1:
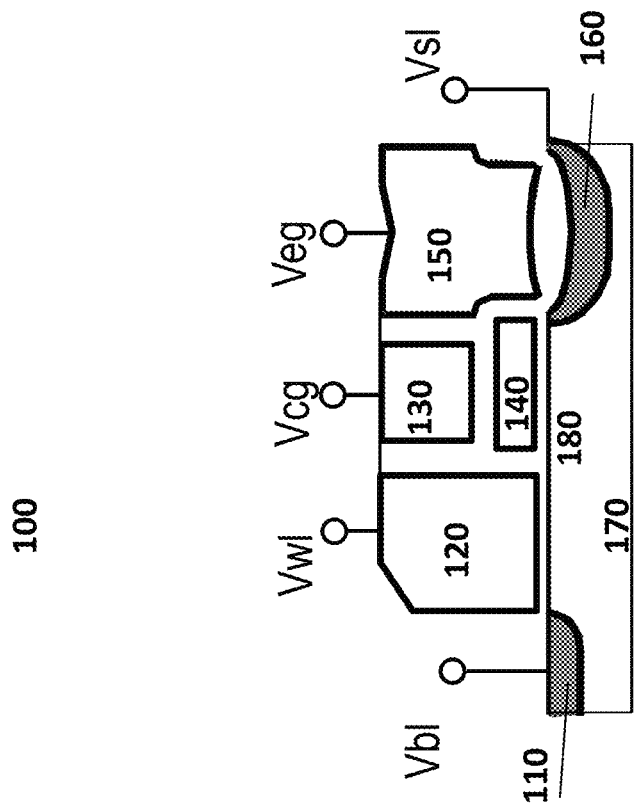
FIG. 1 is a cross-sectional view of a non-volatile memory cell of the prior art to which the method of the present invention can be applied.
Figure 2:
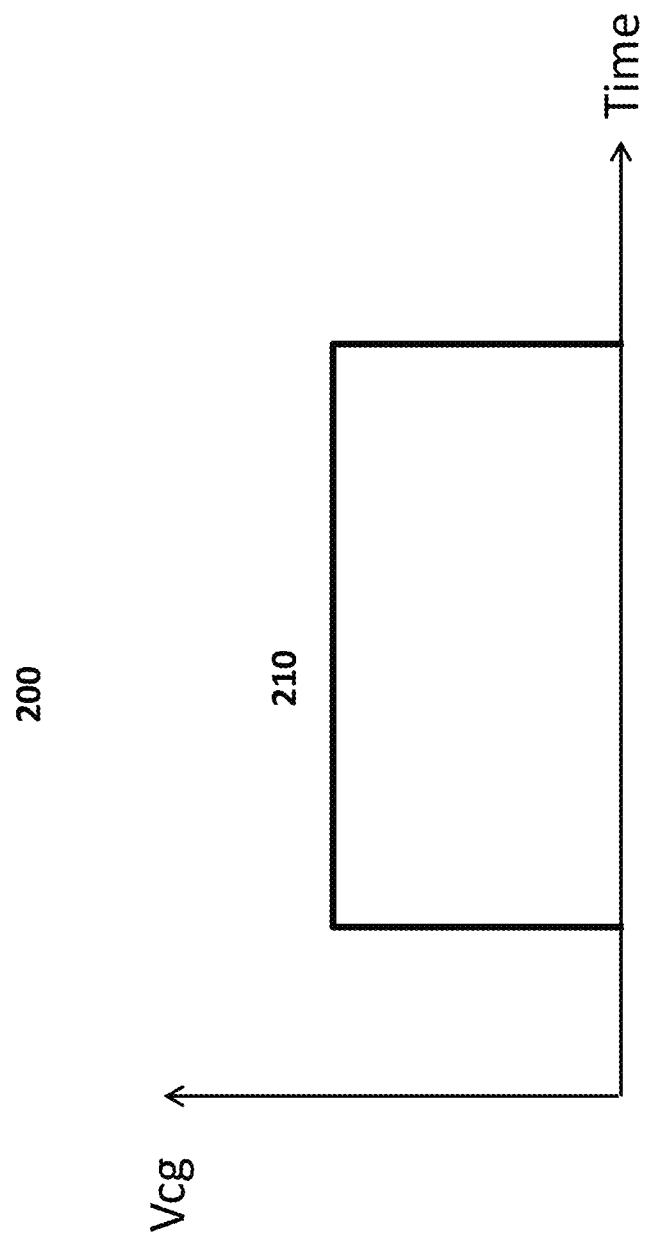
FIG. 2 is a depiction of a voltage applied to a control gate during a prior art programming operation of a memory cell.
Figure 3:
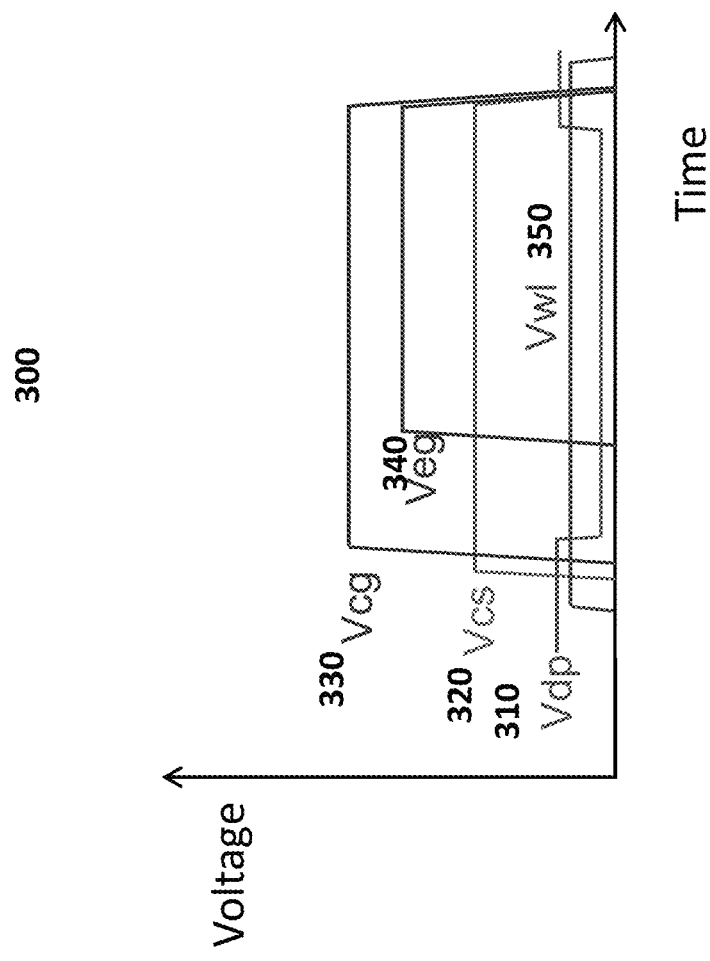
FIG. 3 is a depiction of voltages applied to a control gate and other portions of the memory cell during a prior art programming operation of a memory cell.
Figure 4:
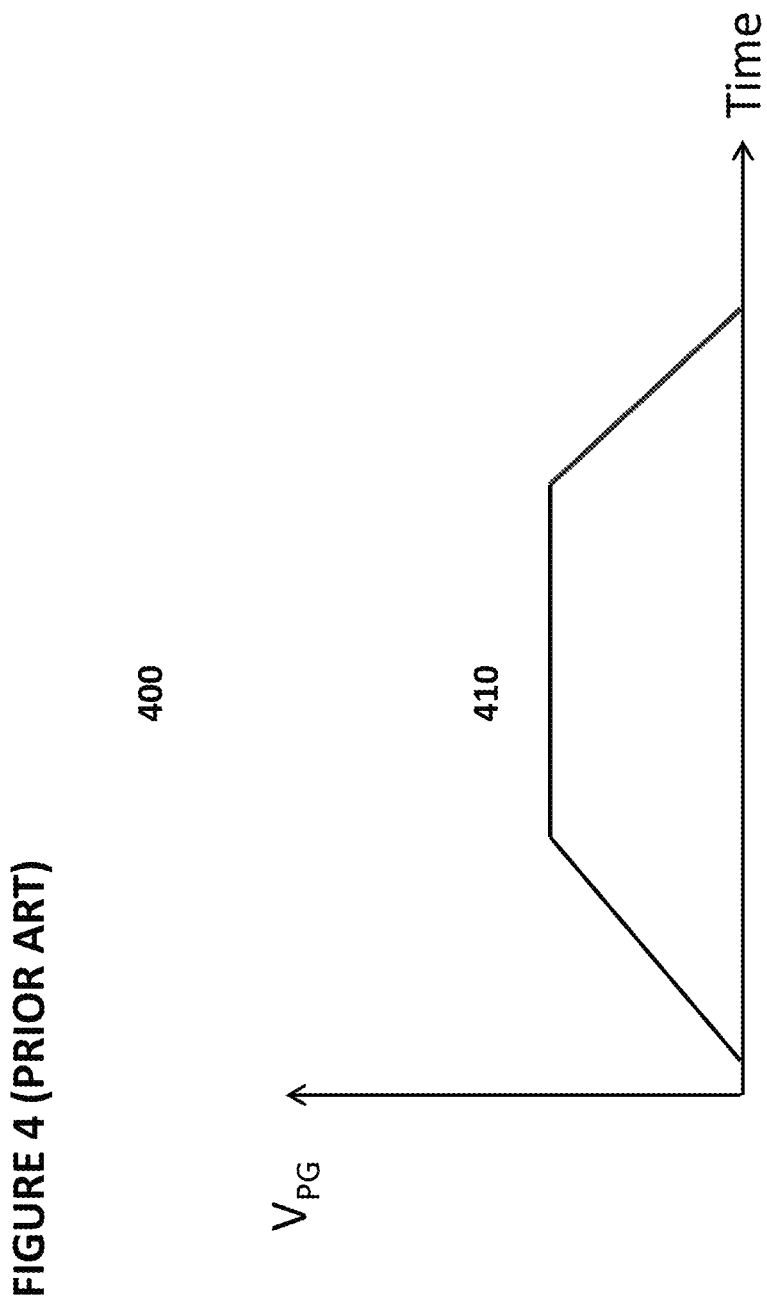
FIG. 4 is a depiction of a voltage applied to a control gate during another prior art programming operation of a memory cell.
Figure 5:
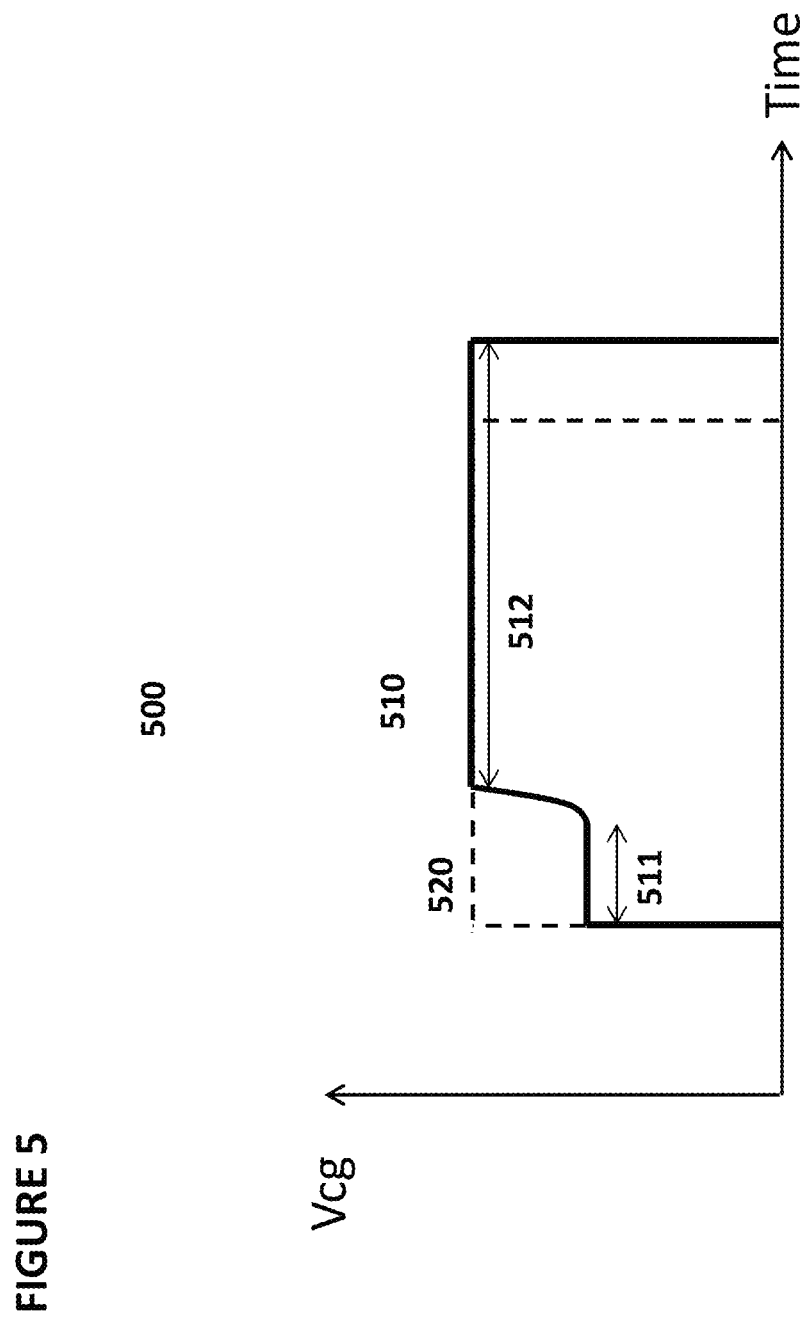
FIG. 5 depicts a signal applied to a control gate in an embodiment of the invention.

FIG. 5 depicts programming embodiment 500. Programming embodiment 500 comprises the use of a control gate signal 510 as depicted. Control gate signal 510 comprises a pre-programming pulse 511 followed by a programming pulse 512. For comparison's sake, conventional control gate signal 520 (which is identical to control gate pulse 210 in FIG. 2) is shown as well.

Pre-programming pulse 511 has a lower peak voltage than conventional control gate signal 520 and has a relatively short duration. Pre-programming pulse 511 is sufficient to cause memory cell 100 to be partially programmed. The peak voltage of programming pulse 512 in this example is the same as for conventional control gate signal 520. However, due to the use of pre-programming pulse 511 and the short interval between pre-programming pulse 511 and programming pulse 512, the ending of programming pulse 512 extends beyond what would be the ending of conventional control gate signal 520, and the programming cycle for control gate signal 510 is longer than the programming cycle for conventional control gate signal 520. Typical values might be 13 μs instead of 10 μs.

The benefit of programming embodiment 500 is that degradation is decreased, because the maximum potential of floating gate 140 is lower than it would otherwise be using conventional control gate signal 520. For example, if conventional control gate signal 520 operates at 10.5 volts, the maximum potential of floating gate 140 is approximately 9 volts for the erased cell at the very beginning of programming. However, when applying control gate signal 510, the maximum potential of floating gate 140 is approximately 2-3V lower than using conventional control gate signal 520 because of using lower voltage of pre-programming pulse 511 around 4-7V. The cell partial programming happens during this step 511 which results in the reduced maximum floating gate potential during next programming pulse 512. Therefore, programming by the method 510 provides lower maximum potential of floating gate, typically by 2-3V, when compared with programming by the method 520. Because degradation is related to the maximum potential of floating gate 140, the usage of control gate signal 510 instead of conventional control gate signal 520 results in less degradation over time. However one drawback of embodiment 500 is that the duration of a programming cycle is greater for control gate signal 510 than for conventional control gate signal 520.

Figure 6:
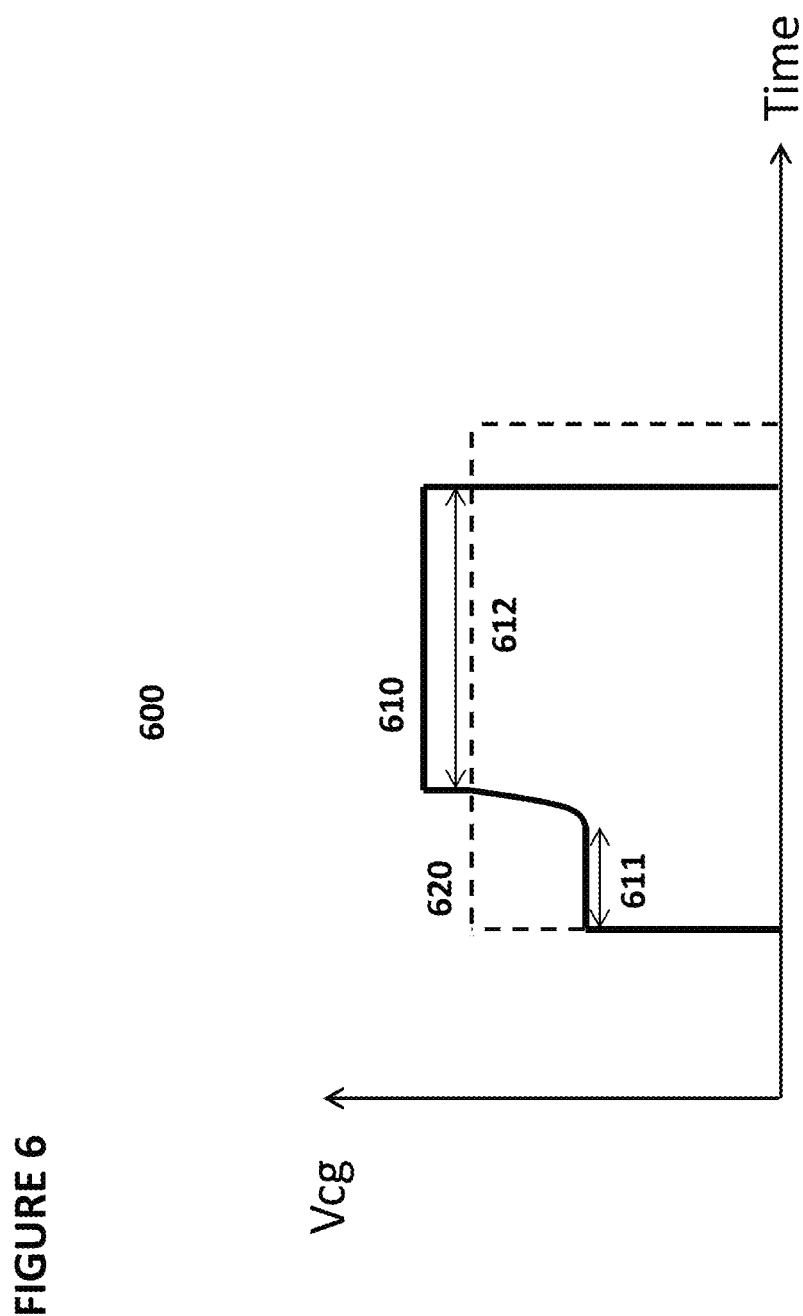
FIG. 6 depicts a signal applied to a control gate in another embodiment of the invention.

FIG. 6 depicts programming embodiment 600. Programming embodiment 600 comprises the use of a control gate signal 610 as depicted. Control gate signal 610 comprises a pre-programming pulse 611 followed by a programming pulse 612. For comparison's sake, conventional control gate signal 620 is shown as well 520 (which is identical to control gate pulse 210 in FIG. 2). Pre-programming pulse 611 has a lower peak voltage than conventional control gate signal 620 and has a relatively short duration. The peak voltage of pre-programming pulse 611 is sufficient to cause memory cell 100 to be partially programmed. Programming pulse 612 in this example has a greater peak voltage than conventional control gate signal 620. As a result, programming pulse 612 has a shorter cycle than conventional control gate signal and control gate signal 520 from FIG. 5.

The benefit of programming embodiment 600 is that degradation is decreased, because the maximum potential of floating gate 140 is lower than it would otherwise be using conventional control gate signal 620. For example, if conventional control gate signal 620 operates at 10.5 volts, the maximum potential of floating gate 140 is approximately 9 volts. However, when applying control gate signal 610, the maximum potential of floating gate 140 is approximately 2-3V lower than using conventional control gate signal 520 because of using lower voltage of pre-programming pulse 511 around 4-7V. Next, to shorten control gate signal 610, one can use higher control gate voltage as compared to 520 and yet keep maximum floating gate potential lower than that of conventional program method 520 because cell is partially programmed after pre-programming pulse 611. Because degradation is related to the maximum potential of floating gate 140, the usage of control gate signal 610 instead of conventional control gate signal 620 results in less degradation over time. Moreover, because the peak voltage of programming pulse 612 is larger than that of conventional control gate signal 620, the duration of one cycle of control gate signal 610 is shorter than that of conventional control gate signal 620.

As to both FIGS. 5 and 6, a read verify step need not be performed after pre-programming pulse 511 or 611 is applied and before programming pulse 512 or 612 is applied because pre-programming pulses 511 and 611 are insufficient to program memory cell 100.

One of skill in the art will appreciate that the duration of pre-programming pulses 511 and 611 and programming pulses 512 and 612 can be varied, and the voltages of pre-programming pulses 511 and 611 and programming pulses 512 and 612 can be varied. These variations will affect the relative degradation of the system, the duration of a programming cycle, and the power consumed during a programming cycle.

In an alternative embodiment, a pre-programming pulse such as pre-programming pulse 511 or pre-programming pulse 611 is applied to multiple words (such as one page of data, which typically comprises 512 words) simultaneously instead of to just one word. This can further reduce the length of time required to program multiple words, as only one pre-programming pulse would need to be applied for all words, and not one pre-programming pulse for each word in sequential fashion.

Figure 7:
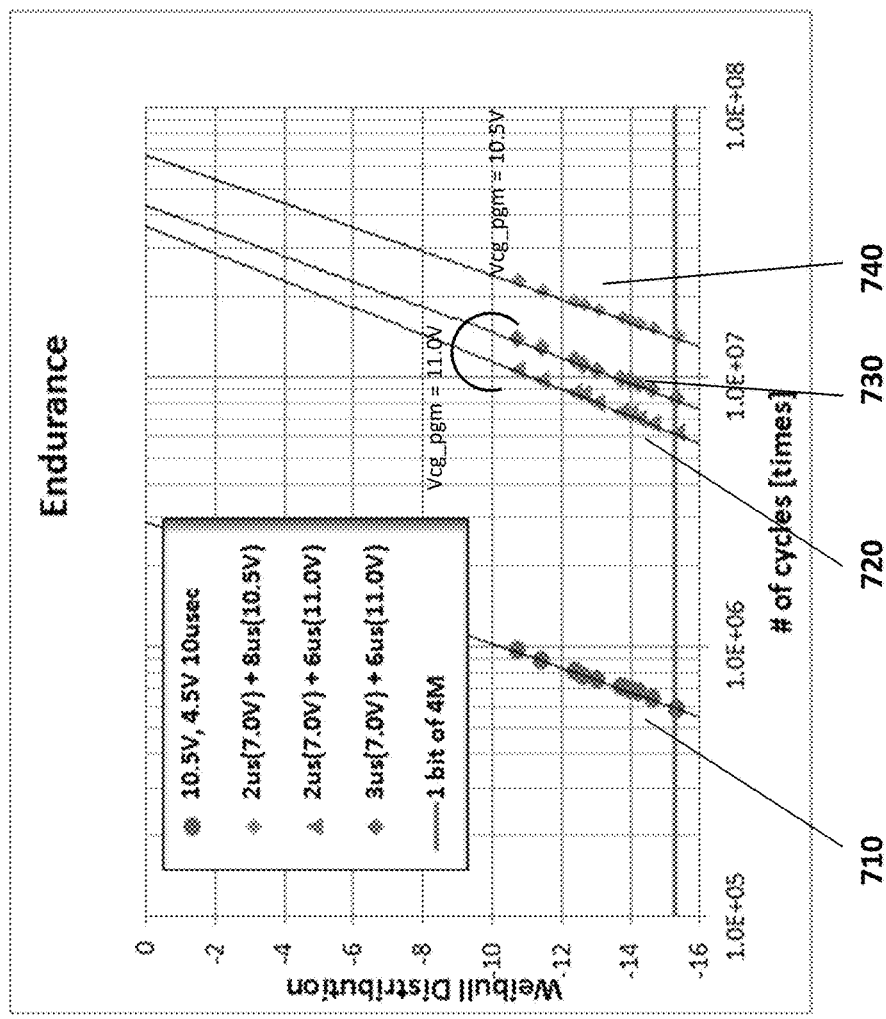
FIG. 7 depicts data comparing the relative degradation of various embodiments of the invention against the prior art.

FIG. 7 depicts exemplary graph 700. Graph 700 depicts data sets 710, 720, 730, and 740, which the applicant gathered through testing of various embodiments. Data set 710 depicts a Weibull Distribution of bit errors (which are largely a result of degradation) against the number of erase-program cycles for a conventional system using a control gate pulse of 10.5 volts for 10 μs. Data set 720 depicts the same aspects for an embodiment using a pre-programming pulse of 7.0 volts for 2 μs and a programming pulse of 10.5 V for 8 μs. Data set 730 depicts the same aspects for an embodiment using a pre-programming pulse of 7.0V for 2 μs and a programming pulse of 11.0 V for 6 μs. Data set 740 depicts the same aspects for an embodiment using a pre-programming pulse of 7.0V for 3 μs and a programming pulse of 11.0 V for 6 μs. A voltage of 4.5 V is applied to erase gate 150 and source line 160 for each data set. As shown in graph 700, the embodiments depicted by data sets 720, 730, and 740 can endure a larger number of programming cycles (by an order of magnitude) compared to the conventional system before the same number of errors occur.

Figure 8:
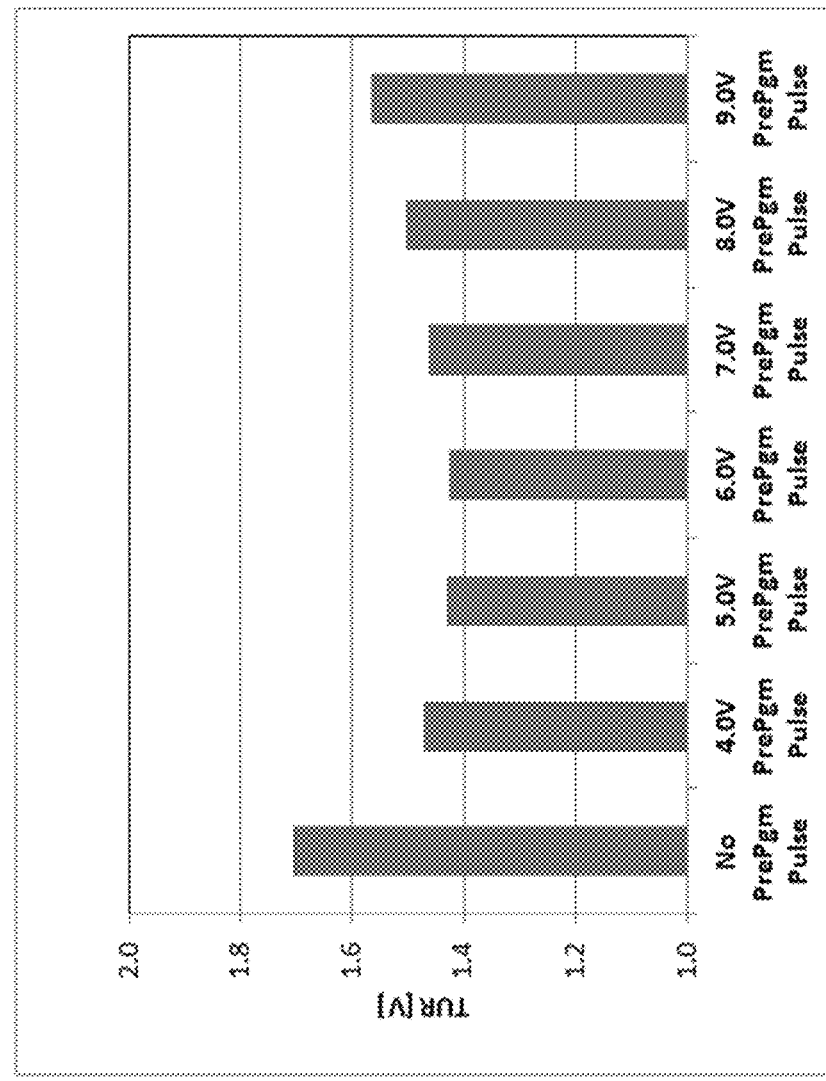
FIG. 8 depicts data comparing the relative degradation of various embodiments of the invention.

FIG. 8 depicts exemplary graph 800. Graph 800 depicts the variation in the increase in voltage required to be applied to erase gate 150 to cause an effective erasing of memory cell 100. Over time, as memory cell 100 degrades, a larger voltage must be applied to erase gate 150 to cause an effective programming to occur. Graph 800 shows the amount of the required increase in voltage for erase gate 150 based on the peak voltage of the pre-programing pulse. The first bar shows no pre-program pulse, and subsequent bars show the increase in voltage required when pre-programming pulses of 4.0 V, 5.0V, 6.0 V, 7.0V, 8.0V, and 9.0V are applied.

As shown in graph 800, applying a pre-programming voltage that is too low or too high does not improve endurance as much as the optimal voltage level. If the pre-programming voltage is too low, it does not provide sufficient reduction of maximum potential of floating gate 140, so degradation occurs to a significant degree as a result of the programming step. If the pre-programming voltage is too high, degradation occurs to a significant degree as a result of the pre-programming step. As shown in graph 800, a pre-programming pulse between 5.0-6.0 V is optimal.

Figure 9:
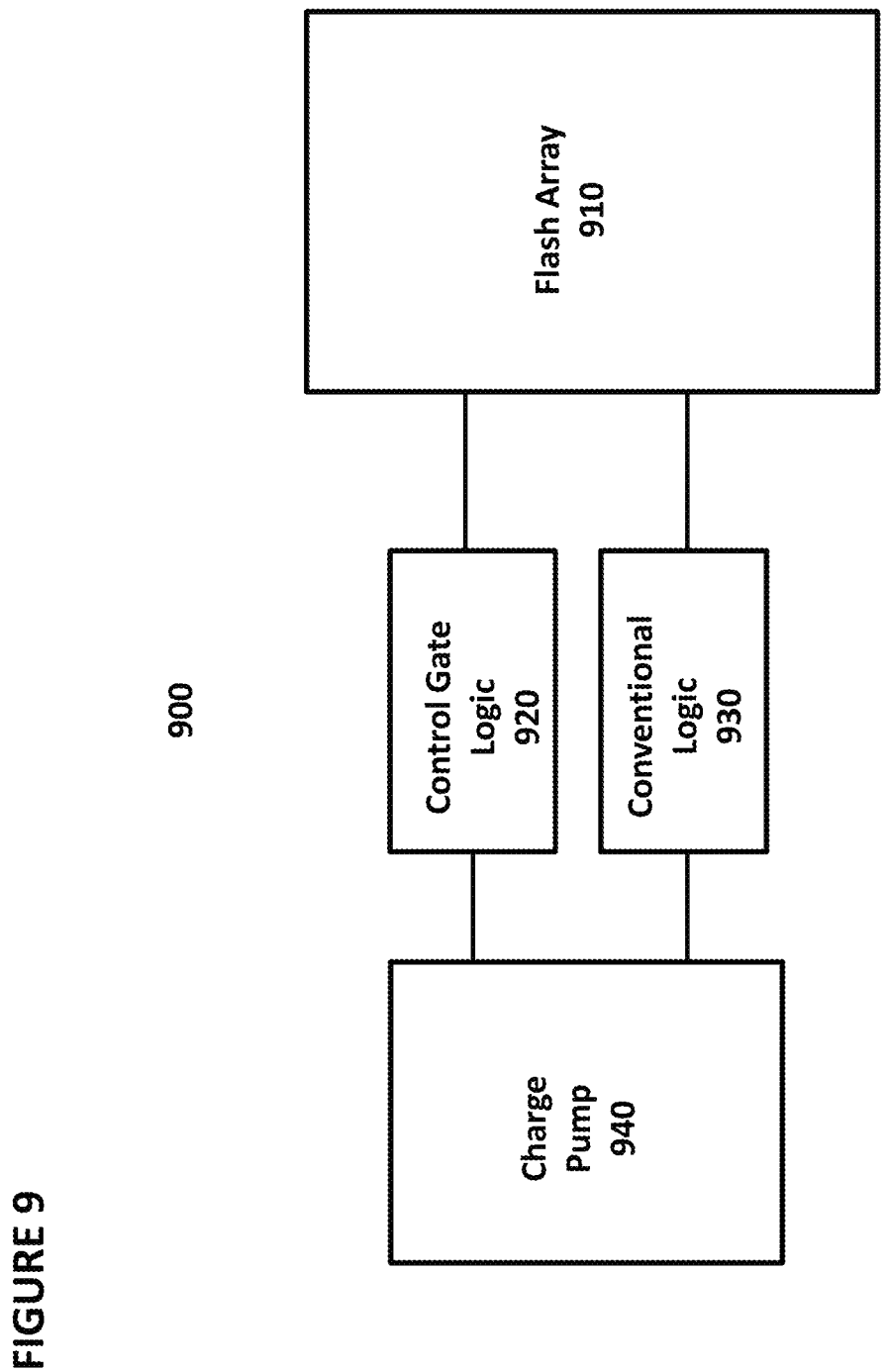
FIG. 9 depicts a flash memory system according to the embodiments of the invention.

FIG. 9 depicts a system for implementing the embodiments described above. Flash array 910 is an array of split-gate flash memory cells as known in the prior art. Control gate logic 920 is used to generate the control gate signals of the embodiments, including pre-programming pulses and programming pulses. Logic 930 is used to generate other signals (such as erase gate signals), and charge pump 940 generates the various voltage required by the embodiments (e.g., 6 V for a pre-programming pulse and 11 V for a program pulse).

It is to be understood that the present invention is not limited to the embodiment(s) described above and illustrated herein, but encompasses any and all variations falling within the scope the disclosure. For example, references to the present invention herein are not intended to limit the scope of any eventual claim or claim term, but instead merely make reference to one or more features that may be covered by one or more eventual claims. Materials, processes and numerical examples described above are exemplary only, and should not be deemed to limit any eventual claims.

What is claimed is:

1. A method of programming a plurality of split-gate memory cells, each cell comprising a floating gate, a control gate terminal, a word line terminal, an erase gate terminal, a bit line terminal, and a source line terminal, the method comprising:
applying a pre-programming voltage to the control gate terminal of each of the plurality of cells, wherein the pre-programming voltage is insufficient to program the plurality of cells; and
applying a programming voltage to the control gate terminal of at least some of the plurality of cells, wherein the programming voltage is sufficient to program the at least some of the plurality of cells;
wherein the programming voltage is larger than 10.5 volts and the total duration of the steps of applying a pre-programming voltage step and applying a programming voltage step is shorter than 10 μs; and
wherein the maximum potential on the floating gate of each of the plurality of cells during the step of applying the programming voltage is between 2-3 volts lower than would result by programming the plurality of cells without first applying the pre-programming voltage.

2. The method of claim 1, wherein the plurality of cells comprises multiple words.

3. The method of claim 2, wherein the plurality of cells comprises a page.

4. The method of claim 2, wherein the at least some of the plurality of cells comprises one and only one word.

5. The method of claim 3, wherein the at least some of the plurality of cells comprises one and only one word.

6. The method of claim 1, wherein no verification of the plurality of cells occurs after the pre-programming voltage is applied and before the programming voltage is applied.

7. The method of claim 1, wherein the pre-programming voltage is between 3 volts and 6 volts lower than the programming voltage.

8. The method of claim 1, wherein the duration of the applying of the pre-programming voltage is three to ten times shorter than the duration of the applying of the programming voltage.

* * * * *